(12) United States Patent
Tavakkoli Kermani Ghariehali et al.

(10) Patent No.: US 11,541,577 B2
(45) Date of Patent: Jan. 3, 2023

(54) TEMPLATE APPARATUS AND METHODS OF USING THE SAME

(71) Applicant: CANON KABUSHIKI KAISHA, Tokyo (JP)

(72) Inventors: Amir Tavakkoli Kermani Ghariehali, Austin, TX (US); Edward Brian Fletcher, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 218 days.

(21) Appl. No.: 16/719,074

(22) Filed: Dec. 18, 2019

(65) Prior Publication Data

US 2021/0187795 A1 Jun. 24, 2021

(51) Int. Cl.
| | | |
|---|---|---|
| *B29C 33/42* | (2006.01) | |
| *B29C 39/26* | (2006.01) | |
| *B29C 59/02* | (2006.01) | |
| *H01L 21/67* | (2006.01) | |
| *G03F 7/00* | (2006.01) | |
| *H01L 21/311* | (2006.01) | |
| *B32B 37/14* | (2006.01) | |

(52) U.S. Cl.
CPC .......... *B29C 33/424* (2013.01); *B29C 39/26* (2013.01); *B29C 59/02* (2013.01); *B32B 37/14* (2013.01); *G03F 7/0002* (2013.01); *H01L 21/31138* (2013.01); *H01L 21/67063* (2013.01)

(58) Field of Classification Search
CPC .............................. B29C 33/424; G03F 7/0002
See application file for complete search history.

(56) References Cited

U.S. PATENT DOCUMENTS

| | | | |
|---|---|---|---|
| 7,654,815 B2 | 2/2010 | Hasegawa et al. | |
| 8,636,498 B2 | 1/2014 | Tsuji et al. | |
| 2006/0177535 A1 | 8/2006 | McMackin et al. | |
| 2010/0084376 A1 | 4/2010 | Khusnatdinov et al. | |
| 2011/0272838 A1* | 11/2011 | Malloy | B29C 33/38 264/39 |
| 2014/0072668 A1 | 3/2014 | Yoneda et al. | |

FOREIGN PATENT DOCUMENTS

JP 5978552 B2 8/2016

OTHER PUBLICATIONS

Zhou, Jianming et al., "Immersion lithography with numerical apertures above 2.0 using high index optical materials," Proceedings of SPIE—The International Society for Optical Engineering, Mar. 2007, 10 pages.

\* cited by examiner

*Primary Examiner* — Christopher T Schatz
(74) *Attorney, Agent, or Firm* — Abel Schillinger, LLP

(57) ABSTRACT

A template and method of using the template is disclosed. The template can include a body with a first side and a second side, and an extension. The extension can include a first surface adjacent the body, a second surface, and a third surface between the first surface and the second surface, where the first surface includes a curvature and where a portion of the curvature of the first surface is interior to the third surface. The method can include dispensing a formable material over a substrate, where the substrate includes a non-uniform surface topography. The method can also include curing the formable material contacting the second surface of the extension to form a layer over the substrate while the formable material contacting the third surface of the extension remains in a liquid state, wherein curing is performed while the template is contacting the formable material.

16 Claims, 6 Drawing Sheets

TEMPLATE APPARATUS AND METHODS OF USING THE SAME

FIELD OF THE DISCLOSURE

The present disclosure relates to substrate processing, and more particularly to whole wafer fluid deposition in semiconductor fabrication.

RELATED ART

Fluid deposition techniques are useful in fabricating electronic devices on semiconductor wafers. Such techniques can include the use of fluid dispense systems for depositing a formable material onto the wafer. A template patterns the dispensed material before the dispensed material is solidified on the wafer. Patterned techniques are useful in fabricating semiconductor devices.

A patterned technique involves dispensing a variable drop pattern of polymerizable material between the substrate and a template, where the drop pattern varies depending on the substrate topography. A template is then brought into contact with the polymerizable material after which the material is polymerized on the substrate, and the template removed. For example, the process for creating a semiconductor device includes repeatedly adding and removing material to and from a substrate. This process can produce a layered substrate with an irregular height variation (i.e., topography), and as more layers are added, the substrate height variation can increase. However, as fluid is added and cured for each layer, buildup can occur on the template itself leading to defects in subsequent processing. Additionally, repeated contact to the fluid can cause the coating degradation or delamination on the template thereby decreasing the lifespan of the template itself.

As such, improvements in fluid deposition techniques are desired to allow for whole wafer processing.

SUMMARY

In an aspect a template is disclosed. The template can include a body with a first side and a second side, and an extension. The extension can include a first surface adjacent the body, a second surface, and a third surface between the first surface and the second surface, where the first surface includes a curvature and where a portion of the curvature of the first surface is interior to the third surface.

In another aspect, the second surface is substantially parallel to the first side of the body and the first side of the body has a recess.

In yet another aspect, the curvature is closer to the third surface than the body of the template.

In yet another aspect, the curvature extends at most one half of a total length of the first surface.

In yet another aspect, the curvature is a concave curvature.

In another aspect, the second surface is orthogonal to the third surface.

In yet another aspect, the template can include a material selected from the group consisting of silica, sodium carbonate, calcium oxide, or any combination thereof.

In a further aspect, the curvature has an angle if internal reflection of between 45 degrees and 90 degrees at a wavelength of 400 nm.

In another aspect, the first surface has a length between 33% and 50% the first distance.

In yet another aspect, an apex of the curvature of the first surface is interior to the third surface.

In a further aspect, the extension is adjacent the second side of the body.

In another aspect, a method of deposition is disclosed. The method can include dispensing a formable material over a substrate, contacting the formable material over the substrate with the template of the aspect above, and curing the formable material over the substrate to form the layer over the substrate while the template is contacting the formable material.

In yet another aspect, curing the formable material is done by one or more light sources.

In a further aspect, the method can further include directing one or more light rays from the one or more light sources away from the third surface of the extension as the formable material is being cured.

In yet another aspect, the extension can direct one or more light rays from the one or more light sources away from the third surface of the extension as the formable material is being cured.

In another aspect, the first surface can direct the one or more light rays from the one or more light sources away from the third surface of the extension as the formable material is being cured.

In another aspect, the method can further include providing a substrate with a substantially uniform topography.

In another aspect, the method can further include providing one or more light sources to the first side of the body of the template and where the light sources are substantially perpendicular to the first side of the body.

In yet another aspect a method of manufacturing a template is disclosed. The method of manufacturing a template can include providing a template, where the template can include a body, where the body can include a first side and a second side, and where the first side of the body comprises a first recess, depositing a first photoresist layer on the second side of the template, dry etching the second side of the template to form a second recess and a third recess, depositing a chromium layer on the second side of the template, depositing a second photoresist layer over a central portion of the second side and within the second recess and third recess, dry etching lateral portions of the second side of the template to form a central protrusion extending from the second side of the template, where the central protrusion can include a first surface, and a base portion, where the base portion is between the first surface of the protrusion and the second surface of the template, wet etching the protrusion to create a curvature on the base portion of the protrusion, where an apex of the curvature is interior to an edge of the first surface of the protrusion, and patterning the first surface of the protrusion to create one or more recesses within the first surface of the protrusion.

In yet another aspect a method of manufacturing an article is disclosed. The method of manufacturing an article can include dispensing a formable material over a substrate, contacting the formable material over the substrate with a template, wherein the template comprises a body, and an extension, wherein the extension comprises a first surface adjacent the body, a second surface, and a third surface between the first surface and the second surface, wherein the third surface is orthogonal to the second surface, and wherein the first surface comprises a curvature, curing the formable material contacting the second surface of the extension to form a layer over the substrate while the formable material contacting the third surface of the extension remains in a liquid state, wherein curing is performed while the template is contacting the formable material, separating the template and the patterned layer on the substrate, processing the substrate on which the patterned layer has been formed, and manufacturing the article from the processed substrate.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the arts.

Figure 1:
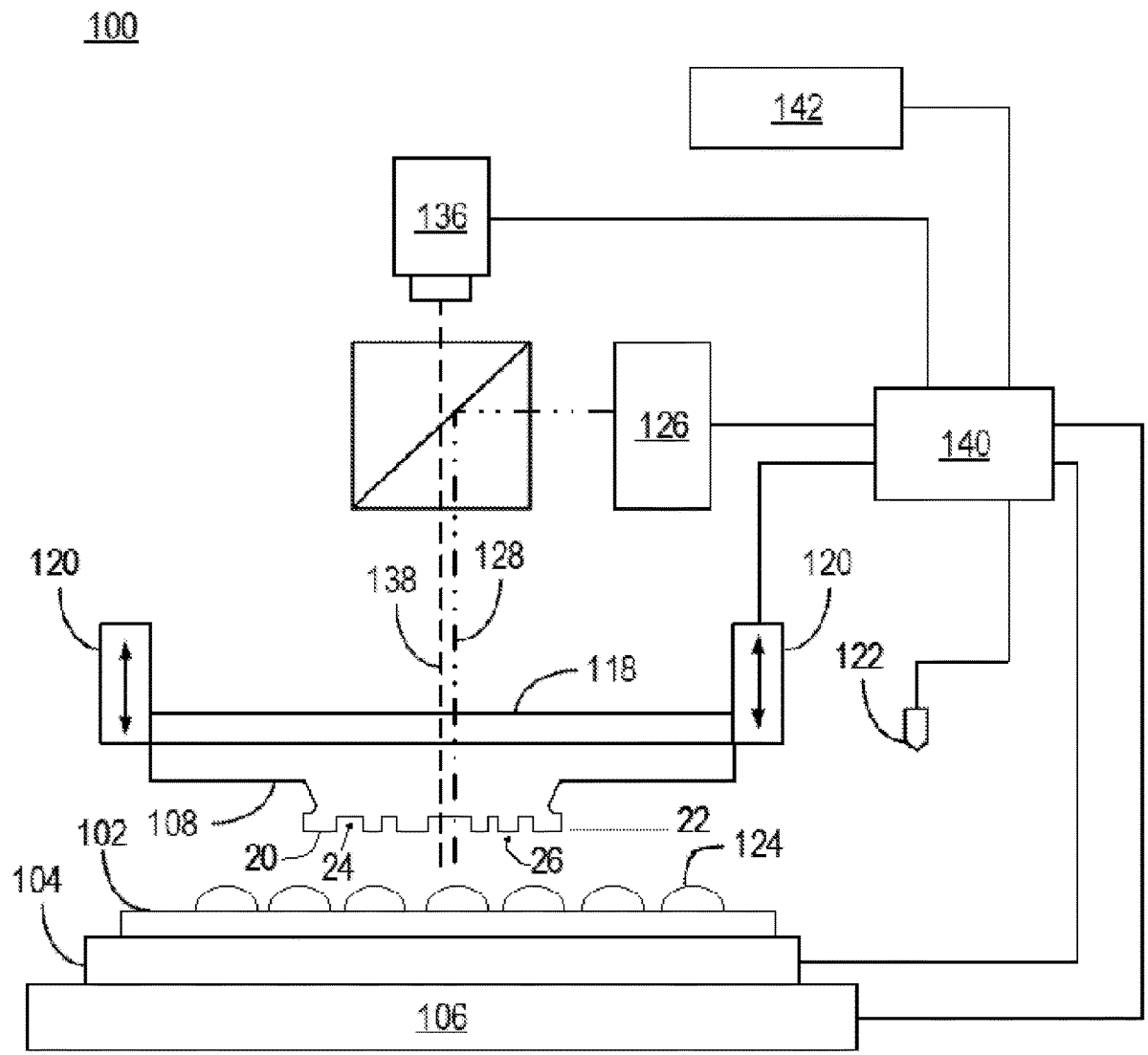
FIG. 1 includes an illustration of a side view of an exemplary system.

Referring to FIG. 1, an apparatus 10 in accordance with an embodiment described herein can be used to pattern a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like. Exemplary chucks are described in U.S. Pat. No. 6,873,087, which is hereby incorporated by reference.

The substrate 102 and the substrate chuck 104 may be further supported by a substrate positioning stage 106. The substrate positioning stage 106 may provide translational and/or rotational motion along one or more of the x-, y-, z-, θ-, ψ-, and φ-axes. The substrate positioning stage 106, the substrate 102, and the substrate chuck 104 may also be positioned on a base (not shown). The substrate positioning stage may be a part of a positioning system.

Spaced apart from the substrate 102 is a template 108, used for a relief pattern on the substrate 102, having a working surface 112 facing substrate 102. Template 108 may include a body having a first dies and a second side with one side having a mesa 20 extending therefrom towards the substrate 12. Mesa 20 may have a patterned surface 22 thereon. In one embodiment, the mesa 20 may be referred to as a mold 20. In another embodiment, the template 108 may be formed without a mesa 20. Template 108 and/or mold 20 may be formed from materials including, but not limited to, fused silica, quartz, silicon, organic polymers, siloxane polymers, borosilicate glass, fluorocarbon polymers, metal, hardened sapphire, and/or the like. In an embodiment the template 108 is readily transparent to UV light. As illustrated, the patterned surface 22 may include featured defined by a plurality of spaced-apart recesses 24 and/or protrusions 26. Patterned surface 22 may define an original pattern that forms the basis of a pattern to be formed on the substrate 102. The mesa 20 can extend from the template 108 body at a thickness range of between 5 microns to 500 microns. The mesa can both define an area of the pattern that will be imprinted on a substrate and prevent the remainder of the template from making contact with any part of the substrate being imprinted during an imprint process. Any contact between the template 108 and the substrate 102 outside of where the formable material 124 has been dispensed runs the risk of causing a defect on the substrate 102 and/or damage to the template 108.

However, when such templates 108 are used, in particular under high throughput conditions, there can be a tendency to form extrusions, defined as the formable material which extends (or extrudes) beyond the border of the mesa surface. Such extruded material can accumulate on the mesa sidewalls and subsequently solidify upon exposure to actinic radiation. During separation of the template from the substrate following the curing of the formable material 124, the extruded, cured material can remain on the mesa sidewall of the template 108, creating a defect that negatively affects subsequent processing. The accumulated material can eventually break off and cause a defect on the substrate. Accordingly, the inventors have discovered a new design, described below, to address extrusion defects.

Template 108 may be coupled to or retained by a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. In an embodiment the template chuck is likewise readily transparent to UV light. The template chuck 118 may include a system such as a zone based vacuum chuck, an actuator array, a pressure bladder, etc., which can apply a pressure differential to a back surface of the template 108 to cause the template to bend and deform. In one embodiment, the template chuck 118 includes a zone based vacuum chuck which can apply a pressure differential to a back surface of the template, causing the template to bend and deform as further detailed herein.

The template chuck 118 may be coupled to a patterning head 120 which is a part of the positioning system. The patterning head 120 may be movably coupled to a bridge. The patterning head 120 may include one or more actuators such as voice coil motors, piezoelectric motors, linear motor, nut and screw motor, etc., which are configured to move the template chuck 118 relative to the substrate 102 in at least the z-axis direction, and potentially other directions (e.g. x-, y-, θ-, ψ-, and φ-axis). Either the patterning head 120, substrate positioning stage 106, or both can vary a distance between the mold 20 and the substrate 102 to define a desired volume there between that is filled by formable material 124.

The apparatus 100 may further comprise a fluid dispenser 122. The fluid dispenser 122 may also be movably coupled to the bridge. In an embodiment, the fluid dispenser 122 and the patterning head 120 share one or more of all positioning components. In an alternative embodiment, the fluid dispenser 122 and the patterned head move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The apparatus 100 may further comprise a curing system that includes a radiation source 126 that directs actinic energy, for example, UV radiation, along an exposure path 128. The patterning head 120 and the substrate positioning stage 106 may be configured to position the template 108 and the substrate 102 in superimposition with the exposure path 128. The radiation source 126 sends the actinic energy along the exposure path 128 after the template 108 has contacted the formable material 128. FIG. 1 illustrates the exposure path 128 when the template 108 is not in contact with the formable material 124. This is done for illustrative purposes so that the relative position of the individual components can be easily identified. An individual skilled in the art would understand that exposure path 128 would not substantially change when the template 108 is brought into contact with the formable material 124.

The apparatus 100 may further comprise a camera 136 positioned to view the spread of formable material 124 as the template 108 contacts the formable material 124 during the patterned process. FIG. 1 illustrates an optical axis 138 of the field camera's imaging field. As illustrated in FIG. 1, the apparatus 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the template 108 and in contact with the formable material 124 and regions underneath the template 108 but not in contact with the formable material 124. The camera 136 may be configured to provide images of the spread of formable material 124 underneath the template 108, and/or the separation of the template 108 from cured formable material 124. The camera 136 may also be configured to measure interference fringes, which change as the formable material 124 spreads between the gap between the surface 112 and the substrate surface.

The apparatus 100 may be regulated, controlled, and/or directed by one or more processors 140 (controller) in communication with one or more components and/or subsystems such as the substrate chuck 104, the substrate positioning stage 106, the template chuck 118, the patterning head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an Internet connected non-transitory computer readable storage device.

In operation, either the patterning head 120, the substrate position stage 106, or both vary a distance between the template 108 and the substrate 102 to define a desired space (a bounded physical extent in three dimensions) that is filled with the formable material 124. For example, the patterning head 120 may be moved toward the substrate and apply a force to the template 108 such that the template 108 contacts and spreads droplets of the formable material 124 as further detailed herein.

Figure 2A:
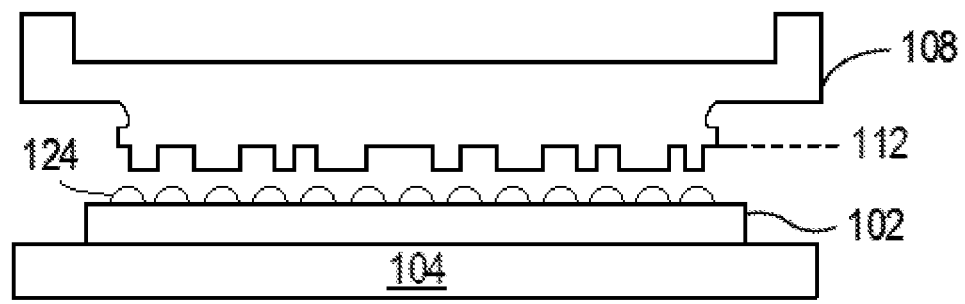
FIGS. 2A-2C include an illustration of a patterned process.
Figure 2B:
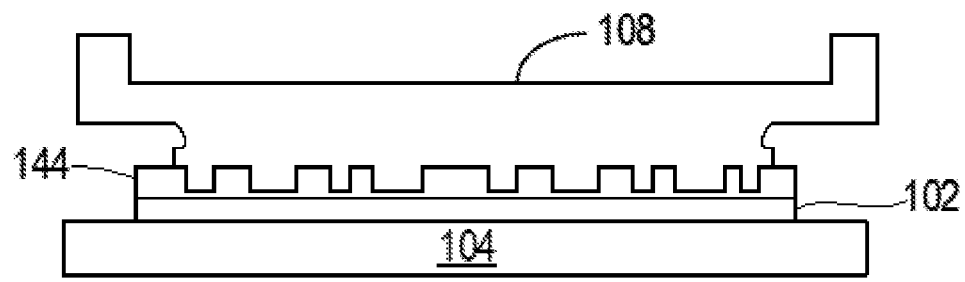
Figure 2C:
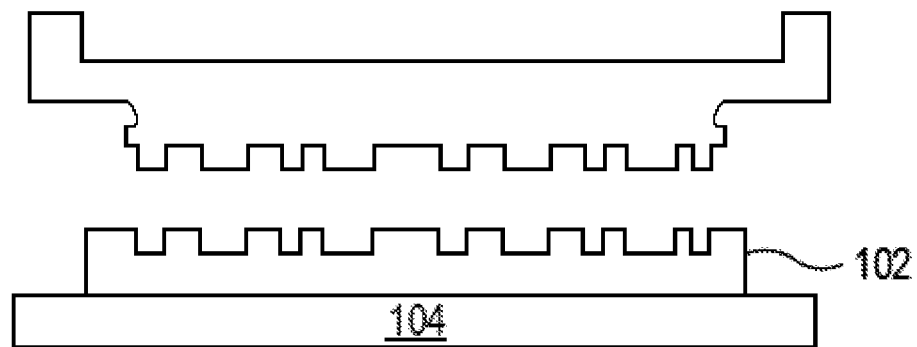

The patterned process includes steps which are shown schematically in FIGS. 2A-2C. As illustrated in FIG. 2A, the formable material 124 is dispensed in the form of droplets onto the substrate 102. In one embodiment, the substrate surface may not have any topography. The template 108 is then positioned in contact with the formable material 124.

FIG. 2B illustrates a post-contact step after the template 108 has been brought into full contact with the formable material 124 but before a polymerization process starts. As the template 108 contacts the formable material 124, the droplets merge to form a formable material film 144 that fills the space between the template 108 and the substrate 102. Preferably, the filling process happens in a uniform manner without any air or gas bubbles being trapped between the template 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 144 to cure, solidify, and/or cross-link, defining a cured patterned layer 146 on the substrate 102. Alternatively, curing of the formable material film 144 can also be initiated by using heat, pressure, chemical reaction, other types of radiation, or any combination of these. Once cured, patterned layer is formed on the substrate 102, the template 108 can be separated therefrom. FIG. 2C illustrates the cured patterned layer on the substrate 102 after separation of the template 108. The substrate and the cured layer may then be subjected to additional known steps and processes for device (article) fabrication, including, for example, planarization, further patterning, curing, oxidation, layer formation, deposition, doping, patterned, etching, formable material removal, dicing, bonding, and packaging, and the like. The substrate may be processed to produce a plurality of articles (devices).

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

Figure 3:
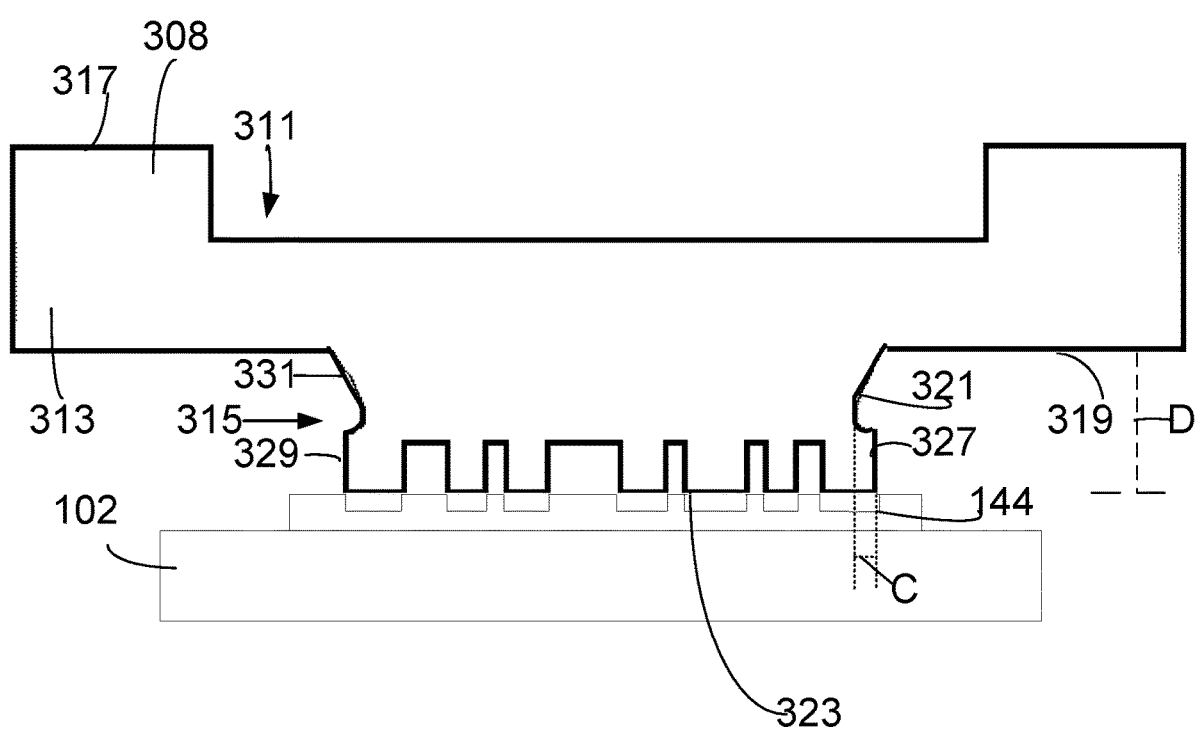
FIG. 3 includes an illustration of a template, according to one embodiment.

FIG. 3 includes an illustration of a template 308, according to one embodiment. The template 308 can be similar to the template 108 described above. The template 308 can include a window 311, a body 313, and an extension 315. In one embodiment, the window 311 is recessed within a first surface 317 of the body 313. The extension 315 can extend from a second surface 319 of the body 313. In one embodiment, the extension 315 can be a mesa. In one embodiment, the first surface 317 is opposite the second surface 319. In one embodiment, the first surface 317 can be a first side. The body 313 can be rectangular, square, polygonal, or any other geometric shape. In one embodiment, the extension 315 can be one cohesive piece of the body 313. In another embodiment, the extension 315 can be a separate piece attached to the second surface 319 of the body 313. In one embodiment, the second surface 319 of the body 313 can include a coating. The coating can include chromium.

The extension 315 can include a first surface 321 extending from the second surface 319 of the body 313, a second surface 323 substantially parallel to the second surface 319 of the body 313, and a third surface 327 connecting the first surface 321 to the second surface 323. The extension 315 can also include a fourth surface 329 opposite the third surface 327, and a fifth surface 331. In one embodiment, the fifth surface 331 can be the mirror image of the first surface 321. In one embodiment, the fourth surface 329 can connect the fifth surface 331 to the second surface 323. In one embodiment, the third surface 327 of the extension 315 is substantially orthogonal to the second surface 319 of the body 313. In one embodiment, the second surface 323 of the extension 315 can face the substrate 102. In one embodiment, the third surface 327 and the fourth surface 329 of the extension 315 can have a length between 1 μm and 15 μm.

In one embodiment, the first surface 321 of the extension 315 and the fifth surface 331 can include a curvature. In one embodiment, the first surface 321 and the fifth surface 331 of the extension 315 can include a curvature that extends at most one half of the total length of the first surface 321. In one embodiment, the first surface 321 and the fifth surface 331 of the extension 315 can include a curvature that extends at most one third of the total length of the first surface 321. In one embodiment, the first surface 321 and the fifth surface 331 of the extension 315 can include a curvature that extends between one-eight of the total length of the first surface and one-half of the total length of the first surface. In one embodiment, the curvature of the first surface of 321 is closer to the third surface 327 of the extension 315 than to the second surface 319 of the body 313. In one embodiment, the curvature of the fifth surface of 329 is closer to the fourth surface 329 of the extension 315 than to the second surface 319 of the body 313. In one embodiment, the first surface 321 and the fifth surface 331 of the extension 315 can include a concave curvature. The second surface 323 of extension 315 can be a distance D from the second surface 319. The distance D can be between 10 μm and 200 μm. In one embodiment, the first surface 321 of the extension 313 can have a length between 33% and 50% the distance D. The curvature of the first surface 321 can extend into the body of the extension 315. In one embodiment, a portion of the curvature of the first surface 321 can be interior to an outer edge of the second surface 319. In one embodiment, the curvature of the first surface 321 extends into the body of the extension 315 by a distance C. The distance C can be the length measured from the farthest point of curvature of the first surface 321 to the third surface 327. In one embodiment, the distance C can be the length measured from an apex of the curvature of the first surface 321 to the third surface 327.

In one embodiment, the apex of the curvature of the first surface 321 can be interior to the third surface 327. In one embodiment, the distance C can be between 0.1 μm and 10 μm. In one embodiment, the distance C can be at least 0.1 μm, at least 0.5 μm, at least 1 μm, at least 2 μm, at least 2.5 μm, or at least 3 μm. In one embodiment, the curvature of the first surface 321 can be interior to the outermost edge of the window 311.

Figure 4:
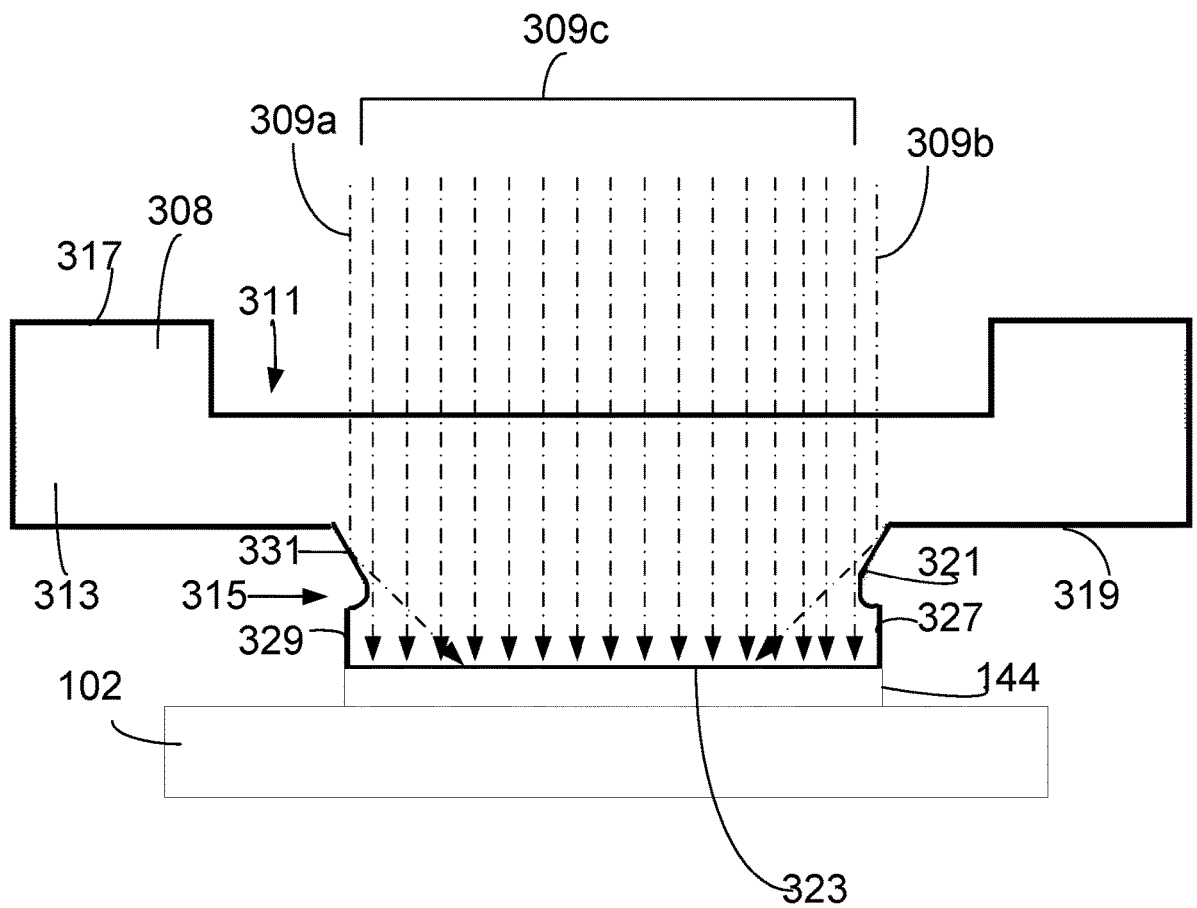
FIG. 4 includes an illustration of a performance of the template of FIG. 3.

FIG. 4 includes an illustration of a performance of the template 308 of FIG. 3. As the template 308 contacts the formable material 124, as seen in FIG. 2A, the droplets merge to form a formable material film 144 that fills the space between the template 308 and the substrate 102. As pressure is applied between the template 308 and the substrate 102, the filling process can cause some formable material to exceed the edges 331, 327 of the extension 315 termed extrusions. Traditionally, as polymerization or curing of the formable material 144 is initiated, the formable material 144 extrusions adjacent to the edges of the extension are also cured. Subsequently, as the template separates from the substrate 102, the extrusions adjacent to the edges of the extension are stuck on and separate with the template leading to a degradation or delamination over time. However, the template 308 is designed to prevent such degradation and to further the life of the template by preventing the actinic radiation from reaching the extrusions adjacent to the edges 331, 327 of the template 308. As seen in FIG. 4, the geometry of the template directs the rays 309a and 309b away from the edges 331, 327 of the extension 315. In one embodiment, the first surface 321 and the fifth surface 331 of the extension 315 direct the rays 309a and 309b away from the edges 331, 327 of the extension 315. As such, any formable material 144 on the third surface 327 and fourth surface 329 will not be cured but instead can evaporate thereby extending the life of the template 308. Thus, the rays 309a, 309b, and 309c can pass through the window 311 to cure the formable material 124 to form the material film 144. As the template 308 separates from the substrate 102, the material film 144 remains on the substrate 102 while the template 308 remains extrusion-free. In one embodiment, the extension 315 can have an angle of incidence with an angle of reflection of between 45 degrees and 90 degrees. In another embodiment, the first surface 321 can have an angle of incidence with an angle of reflection of between 45 degrees and 90 degrees. In another embodiment, the fifth surface 331 can have an angle of incidence with an angle of reflection of between 45 degrees and 90 degrees.

Figure 5:
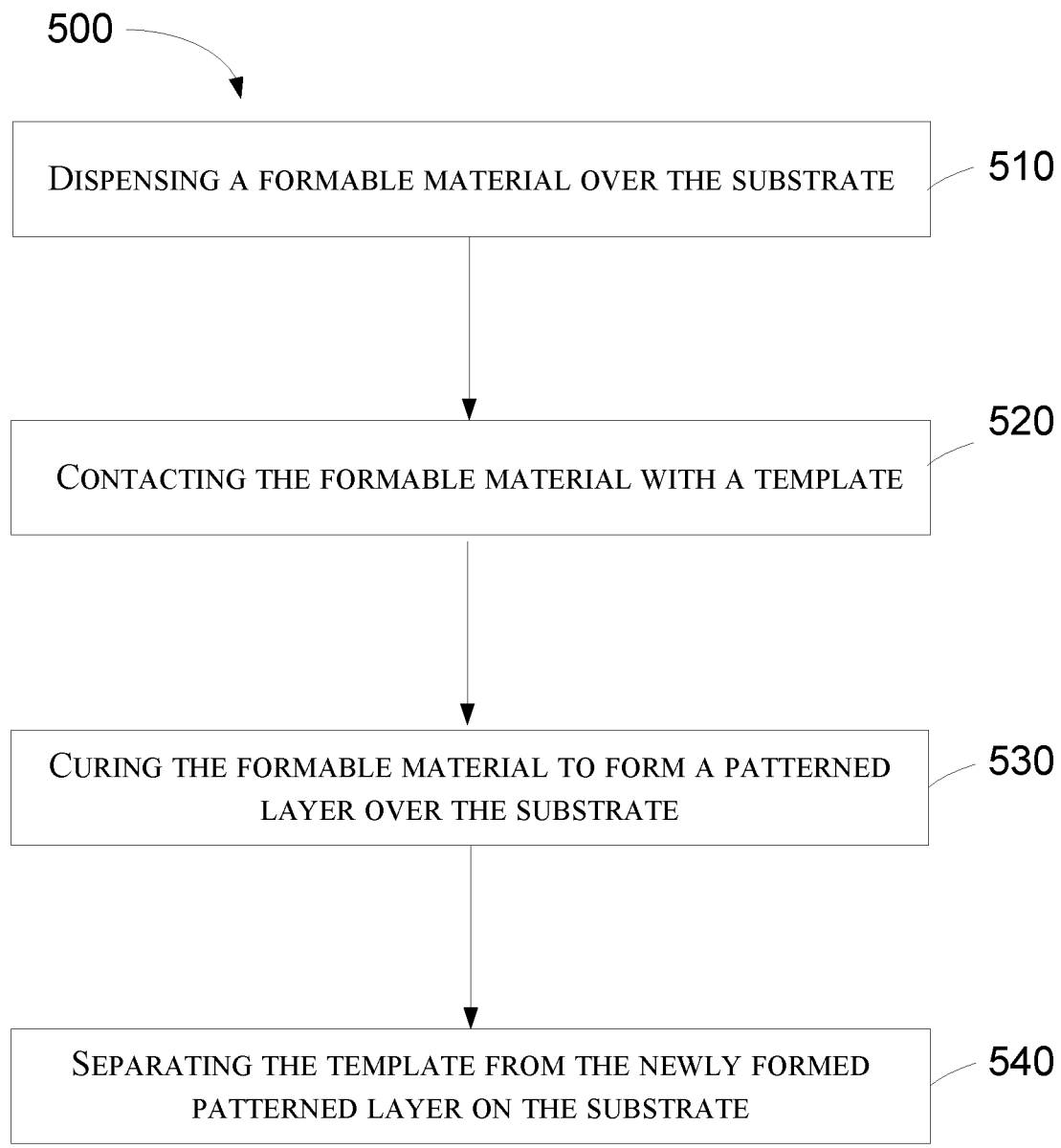
FIG. 5 includes an illustration of a method of the present disclosure, according to one embodiment.

FIG. 5 includes an illustration of a method 500 of the present disclosure, according to one embodiment. The method begins at operation 510 by dispensing formable material 124 onto the substrate 102. In one embodiment, the formable material 124 dispensed may be in the form of droplets. In one embodiment, the substrate 102 can include a non-uniform surface topography. In another embodiment, a surface of the substrate 102 may be non-uniform. In another embodiment, the surface of the substrate 102 may be uniform. In yet another embodiment, the surface of the substrate 102 may have a repeating or periodic pattern. The formable material 124 can include a polymerizable material, such as a resist. The formable material 124 can be positioned on the substrate 102 in one or more layers using techniques such as droplet dispense, spin-coating, dip coating, chemical vapor deposition (CVD), physical vapor deposition (PVD), thin film deposition, thick film deposition, or combinations thereof. The formable material 124 can be dispensed upon the substrate 102 before or after a desired volume is defined between the template 308 and the substrate 102.

At operation 520, a template 308 can contact the formable material 124. As the template 308 contacts the formable material 124, any trapped gas particles can dissipate through the curing layer, the substrate or the template 308. In one embodiment, the template 308 can have a body and an extension 315, as described above. In one embodiment, the template 308 can include a body 313, a window 311, and an extension 315, where the extension includes a first surface adjacent the body 313, a second surface facing the formable material, and a third surface between the first surface and the second surface, where the first surface includes a bend and where the second surface is orthogonal to the third surface. In one embodiment, the template can contact the formable material 124 to form a film on the substrate 102.

At operation 530, the formable material 124 can be cured to form a layer over the substrate 102. In one embodiment, curing is performed while the template 308 is contacting the formable material 124. In one embodiment, one or more light sources are positioned over the window 311 after the formable material 124 is dispensed on the substrate 102. The formable material 124 can include a monomer or oligomer mixture that can be cured using ultraviolet light, heat, or the like. In one embodiment, the extension 315 can direct one or more light rays from the one or more light sources away from the third surface 327. In one embodiment, the first surface 321 can direct one or more light rays from the one or more light sources away from the third surface 327. The one or more light sources can be continuous. In another embodiment, the one or more light sources can be pulsed. The one or more light sources can shine for a period between 0.01 second and 20 seconds. The one or more light sources can be a probe-type light, such as a laser diode with beam shaping optics. In another embodiment, the one or more light sources can be a LED with DMD. In another embodiment, the formable material 124 contacting the second surface 323 can be cured while the formable material 124 contacting the third surface 327 can remain in a liquid state.

The method can continue at operation 540, the template 308 can be separated from the newly formed layer 144 formed on the substrate 102. As the template 308 separates, the formable material that was on the template evaporates away thereby preventing any extrusion defects that would have otherwise occurred.

Figure 6A:
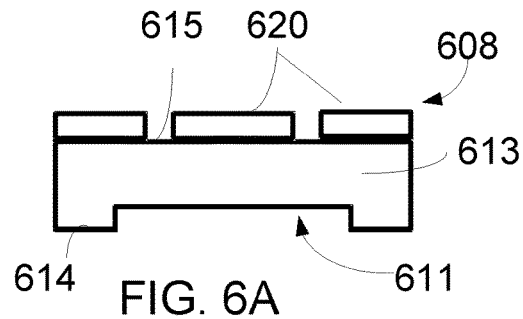
FIGS. 6A-6K show a method of manufacturing a template, according to one embodiment.

FIGS. 6A-6K show a method of manufacturing a template, such as template 308 described above, according to one embodiment. The method can include providing a template 608, as seen in FIG. 6A. The template 608 can include a body 613 with a first side 614 and a second side 615. In one embodiment, the template 608 can include a recess 611 on the first side of the body 613. The method continues with a lithography step. In one embodiment, the lithography step is photolithography. In another embodiment, the lithography step is imprint lithography. In another embodiment, the lithography step can utilize a spin-on technique. A photoresist layer 620 is deposited and patterned on the second side 615 of the template 608.

Figure 6B:
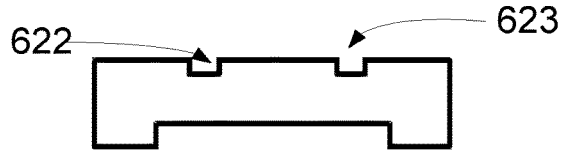

The method can continue, as shown in FIG. 6B, by dry etching the template 608 to create recess 622 and 623 on the second side 615. Dry etching can be accomplished by ion milling or reactive ion etching. Once the recesses are formed, the photoresist layer 620 can be removed.

Figure 6C:
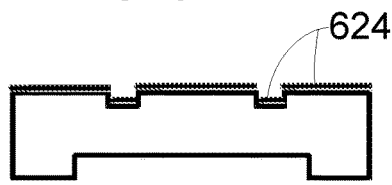

As seen in FIG. 6C, a chromium layer 624 can then be deposited on the exposed surface of the second side 615 as well as the top surface of the recesses 622 and 623. The chromium layer 624 is used as a selective material in the etching process.

Figure 6D:
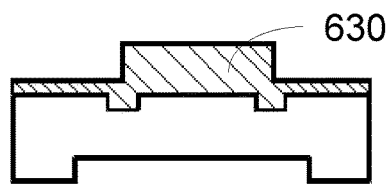
Figure 6E:
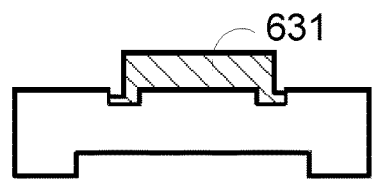

As seen in FIGS. 6D-6E, a second photolithography and a second dry etching step can further define the template 608. In one embodiment, the second photolithography layer 630 is deposited over the second side 615, including recesses 622 and 623, and is subsequently patterned to form the second patterned photolithography layer 631. In another embodiment, the second layer 630 can be deposited using imprint lithography over the second side 615, including recesses 622 and 623, and subsequently patterned to form the second patterned imprint lithography layer 631. In one embodiment, the second patterned photolithography layer 631 extends over a central portion of the second side 615 and within recesses 622 and 623 while leaving the lateral portions of the second side 615 exposed. The second dry etching step can expand the first recess 622 and second recess 623 to create a protrusion 625 and lessen the thickness of the body 613 of the template 608. The protrusion 625 extends from the second side 615 of the template 608. In one embodiment, the protrusion 625 is separated from the body 613 of the template 608.

Figure 6F:
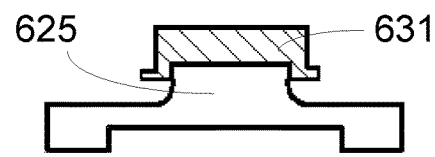
Figure 6G:
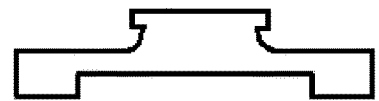

FIGS. 6F and 6G further define the side walls 618 of the protrusion 625. The method includes a wet etching step, as seen in FIG. 6F, and removal of the second patterned photolithography layer 631 and chromium layer 624 remaining on the protrusion 625, as seen in FIG. 6G. In one embodiment, the sidewalls can have an angle of internal reflection defined by the formula Theta=Arcsin (1/n), where n is the refractive index of glass.

Figure 6H:
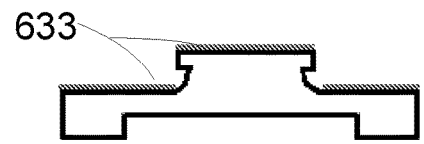
Figure 6I:
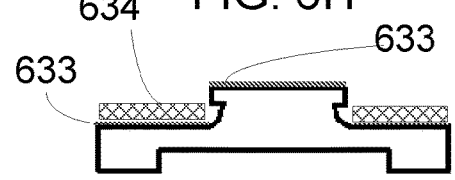
Figure 6J:
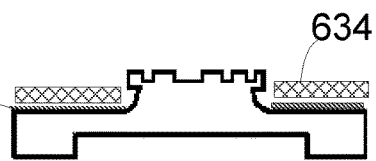
Figure 6K:
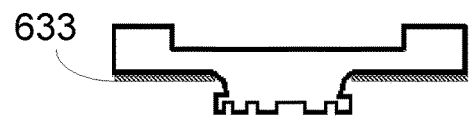

The method can continue by further patterning the protrusions to include recesses and protrusions, as seen in FIGS. 6H-6I. In one embodiment, a UV block layer 633 can be deposited on the protrusion 625 and second side 615 of the template 608, as seen in FIG. 6H. A mask material 634 can be deposited on the second side 615 of the template 608, as seen in FIG. 6I, and a subsequent dry etching can be performed on the protrusion 625, as seen in FIG. 6J. In one embodiment, the UV block layer 633 can remain on the template. Finally, the template, as seen in FIG. 6K, can be used in manufacturing an article.

In one embodiment a method of manufacturing an article can include dispensing a formable material 124 over a substrate 102. The substrate 102 can include a non-uniform surface topography and the substrate 102. The method of manufacturing an article can also include contacting the formable material 124 with a template 308, curing the formable material contacting the second surface 323 to form a layer over the substrate 102 while the formable material 124 contacting the third surface 327 remains in a liquid state, where curing is performed while the template 308 is contacting the formable material 124, separating the template 308 and the patterned layer on the substrate 102, processing the substrate 102 on which the patterned layer has been formed, and manufacturing the article from the processed substrate 102.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A template, comprising:
   a body with a first side and a second side; and
   an extension, wherein the extension comprises:
      a first surface extending from the second side of the body;
      a second surface, wherein the second surface is parallel to the second side of the body; and
      a third surface between the first surface and the second surface, wherein the third surface is perpendicular to the second surface, wherein the third surface is closer to the second side than the second surface, wherein the first surface includes a curvature, wherein a portion of the curvature of the first surface is interior to the third surface, wherein a portion of the curvature of the first surface is closer to a center of the extension than the third surface, wherein the third surface has a first end that abuts the first surface and a second end that abuts the second surface, and wherein the second surface is configured to contact a formable material on a substrate.

2. The template of claim 1, wherein the second surface is substantially parallel to the first side of the body and wherein the first side of the body comprises a recess.

3. The template of claim 1, wherein the curvature extends at most one half of a total length of the first surface.

4. The template of claim 1, wherein the curvature is a concave curvature.

5. The template of claim 1, wherein the template comprises a material selected from the group consisting of silica, sodium carbonate, calcium oxide, or any combination thereof.

6. The template of claim 5, wherein the curvature has an angle of internal reflectance of between 45 degrees and 90 degrees at a wavelength of 400 nm.

7. The template of claim 6, wherein the first surface has a length between 33% and 50% a first distance, and wherein the first distance is measured between the second surface of the extension and the second surface of the body.

8. The template of claim 1, wherein an apex of the curvature of the first surface is interior to the third surface.

9. The template of claim 1, wherein the extension is adjacent the second side of the body.

10. A method of forming a layer on a substrate, comprising:
    dispensing a formable material over the substrate;
    contacting the formable material over the substrate with the template of claim 1; and
    curing the formable material over the substrate to form the layer over the substrate while the template of claim 1 is contacting the formable material.

11. The method of claim 10, wherein curing the formable material is done by one or more light sources.

12. The method of claim 11, further comprising directing one or more light rays from the one or more light sources away from the third surface of the extension of claim 1 as the formable material is being cured.

13. The method of claim 12, wherein the extension of the template of claim 1 can direct one or more light rays from the one or more light sources away from the third surface the extension of claim 1 as the formable material is being cured.

14. The method of claim 12, wherein the first surface of the template of claim 1 can direct the one or more light rays from the one or more light sources away from the third surface of the extension of claim 1 as the formable material is being cured.

15. The method of claim 10, wherein the substrate has a substantially uniform topography.

16. The method of claim 10, further comprising providing one or more light sources to the first side of the body of the template of claim 1 and wherein the light sources are substantially perpendicular to the first side of the body.

* * * * *